United States Patent [19]
Yavelberg

[11] Patent Number: 5,767,781
[45] Date of Patent: Jun. 16, 1998

[54] METHOD FOR DETECTION OF FAILED HEATER IN A DAISY CHAIN CONNECTION

[75] Inventor: Simon Yavelberg, Cupertino, Calif.

[73] Assignee: Applied Materials, Inc., Santa Clara, Calif.

[21] Appl. No.: 490,657

[22] Filed: Jun. 15, 1995

[51] Int. Cl.[6] ................................. G08B 21/00
[52] U.S. Cl. .................. 340/661; 340/660; 340/662; 340/664; 324/522; 324/500; 324/512; 324/529
[58] Field of Search .................. 340/661, 660, 340/662, 663, 664, 310.01, 508, 458; 324/522, 525, 500, 512, 529

[56] References Cited

U.S. PATENT DOCUMENTS

| | | | |
|---|---|---|---|
| 3,671,955 | 6/1972 | Malekzadeh | 340/908 |
| 3,886,932 | 6/1975 | Suessmilch | 340/664 |
| 4,110,683 | 8/1978 | Cason et al. | 324/52 |
| 4,366,433 | 12/1982 | Imazeki et al. | 340/661 |
| 4,583,086 | 4/1986 | Andrews et al. | 340/664 |
| 4,639,719 | 1/1987 | Pappano et al. | 340/652 |
| 4,858,141 | 8/1989 | Hart et al. | 340/664 |
| 5,014,043 | 5/1991 | Lopetrone et al. | 340/664 |
| 5,218,298 | 6/1993 | Vig | 340/661 |
| 5,343,155 | 8/1994 | Kejariwal et al. | 324/522 |
| 5,586,043 | 12/1996 | Breen et al. | 364/483 |

FOREIGN PATENT DOCUMENTS 0 453 659 A1  10/1991  European Pat. Off. ......... H02J 13/00

*Primary Examiner*—Thomas Mullen
*Assistant Examiner*—Ashok Mannava
*Attorney, Agent, or Firm*—Michael A. Glenn

[57] ABSTRACT

Currents input to and output from a device, such as a heater, in a daisy chain connection are measured and compared. Failure of an individual device, as well as device location, is indicated if no current is consumed by the device. A latch is activated in response to detection of a non-functioning device, sending a signal that gives notice and location of the failure.

18 Claims, 5 Drawing Sheets

METHOD FOR DETECTION OF FAILED HEATER IN A DAISY CHAIN CONNECTION

BACKGROUND OF THE INVENTION

1. Technical Field

The invention relates to detection of a failed electrical component. More particularly, the invention relates to the detection of a failed heater in a daisy chain connection.

2. Description of the Prior Art

Many industrial processes require the use of heated pipelines for transmission of liquid or gaseous materials. Frequently, the pipelines must be maintained at specific temperatures. This is readily accomplished by placing heater or refrigeration units along the line.

An array of heaters connected in parallel for placement along such a pipeline is often referred to as a daisy chain. Occasionally one of these heaters fails, resulting in an uneven temperature gradient along the line. It is of critical importance to detect quickly the heater's failure, such that repairs are effected before the pipeline or its contents are adversely affected by the uneven heating.

In the prior art, the methods available for determining that a heater is malfunctioning include routinely inspecting each heater, and measuring the difference between current input to and output from the daisy chain to detect any variation from typical current consumption levels. For example, because a failed heater results in less load on the system, monitoring the current difference indicates that a heater has failed. However, the malfunctioning heater's location must still be determined.

Both prior art methods require the individual inspection of all heaters in the daisy chain to locate the failed unit. This labor intensive search is expensive and slow. During the time required to discover a heater failure and to locate its source, the uneven heating of the pipeline may have had adverse effects. It would therefore be a significant advance in the art to provide a method for quickly and easily detecting and locating a failed heater in a daisy chain connection.

SUMMARY OF THE INVENTION

The invention provides an apparatus and method for detecting a failed heater in a daisy chain connection. The currents input to, and output from, each heater in the daisy chain are remotely measured and compared. Because an inoperative heater has no load, the output current for such heater is equal to the heater's input current. Failure of the individual heater is thus indicated by a measured zero current difference.

In the preferred embodiment of the invention, inductive coupling, for example by use of current transformers, is employed to detect the input and output currents of each heater in the daisy chain. The input and output currents are converted to voltages and their difference is measured. This voltage difference is, in turn, compared with a small bias voltage supplied to a comparator. Heater failure is indicated where the input voltage difference is less than the bias voltage. A latch is activated in response to a logic signal, indicating heater failure and heater location.

DETAILED DESCRIPTION OF THE INVENTION

The invention provides a method and apparatus for detecting and locating a failed heater in a daisy chain connection. In applications such as heated pipelines, it is critical to maintain constant temperature along the length of the line to avoid introducing temperature gradients that may affect a manufacturing process. For example, the failure of an individual heater can cause condensation in the cold spots of a gas line, and would therefore have serious consequences, unless quickly detected and repaired.

The invention exploits to advantage the fact that the currents input to and output from an inoperative heater, when measured and compared, are equal because an inoperative heater has no load, i.e. it does not consume current. Failure of the individual heater is thus indicated by a measured zero current difference between current into a specific heater and current out of the heater.

Figure 1:
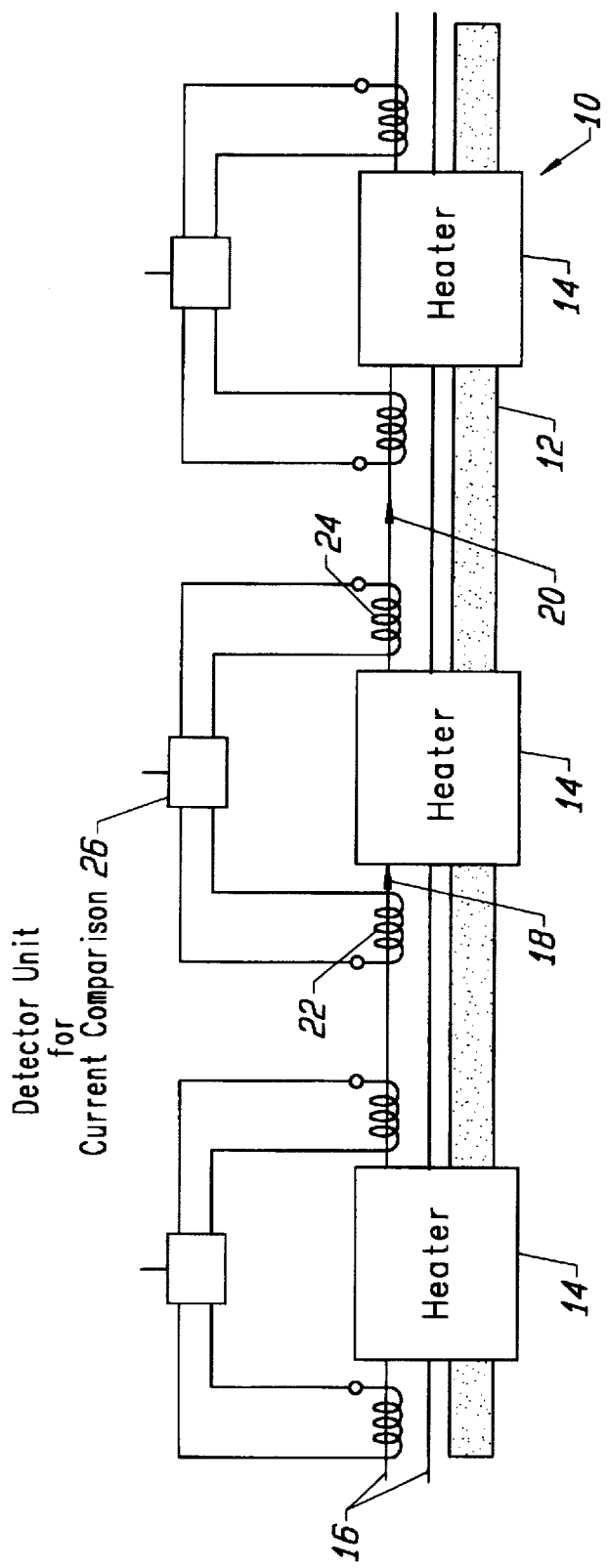
FIG. 1 is a schematic diagram of a daisy chain of heaters and detector units for failed heaters according to the invention.

FIG. 1 is a schematic diagram of a daisy chain of heaters and detector units according to the invention. A daisy chain 10 is formed of individual heaters 14 that are electrically connected in parallel. The heaters are placed at spaced locations along a pipeline 12 to maintain the pipeline contents at a constant temperature along the pipeline. A conductor pair 16 provides (at a node 18) electrical input to, and brings (at a node 20) electrical output from, each heater. The conductor pair may be located along the outside perimeter of the pipeline, or it may be incorporated into the jacket of the pipeline itself.

A first current monitor 22 measures the input current to an individual heater, while a second current monitor 24 measures the output current of the heater. The input and output currents are then compared by a detector unit 26. Substantially equal input and output currents indicate that the heater is not drawing current, and therefore is not functioning. The input currents may be directly measured, or they may first be converted to voltages and then compared. This conversion to voltages may be accomplished by known methods, such as with a transresistance amplifier.

In the preferred embodiment of the invention, voltages are compared by a comparator. In an alternate embodiment of the invention, the current monitors are transducers, inductively coupled to the input and output wires. In yet another embodiment of the invention, the current monitors are Hall effect probes. A Hall effect probe is a magnetic flux density sensor that produces a voltage proportional to the magnetic flux density. The magnetic fields generated by the input and output electrical currents can thus be indirectly compared to determine whether the heater is drawing current and therefore functioning properly.

Figure 2A:
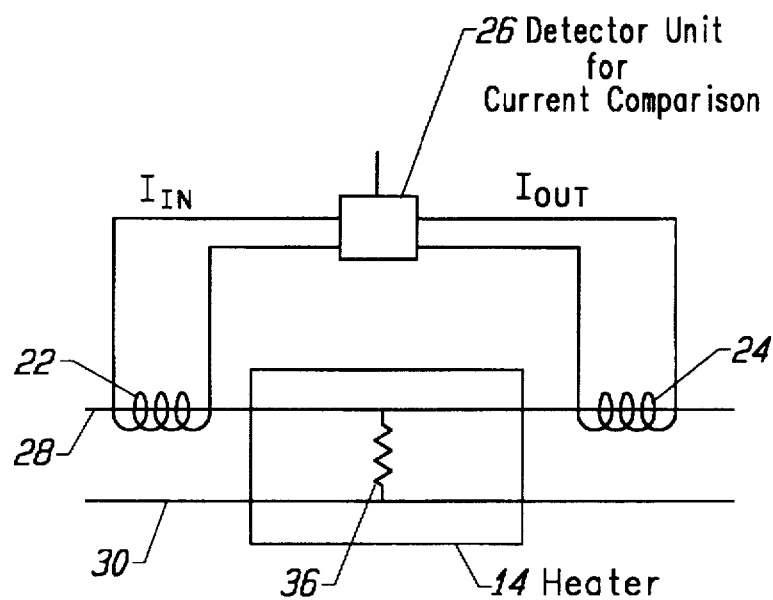
FIG. 2a is a schematic diagram of a heater and detector unit according to the invention.

FIG. 2a is a schematic diagram illustrating a heater and detector unit according to the invention. Input current is communicated to the heater 14 through first and second electrical input lines 28,30. A functioning heater is a load 36 on the input current. Thus, the current level detected by an inductor 24 at an output location is lower than the current detected by an inductor 22 at an input location. In this embodiment of the invention, the inductive current detectors 22, 24 are connected in parallel to the detector unit 26.

Figure 2B:
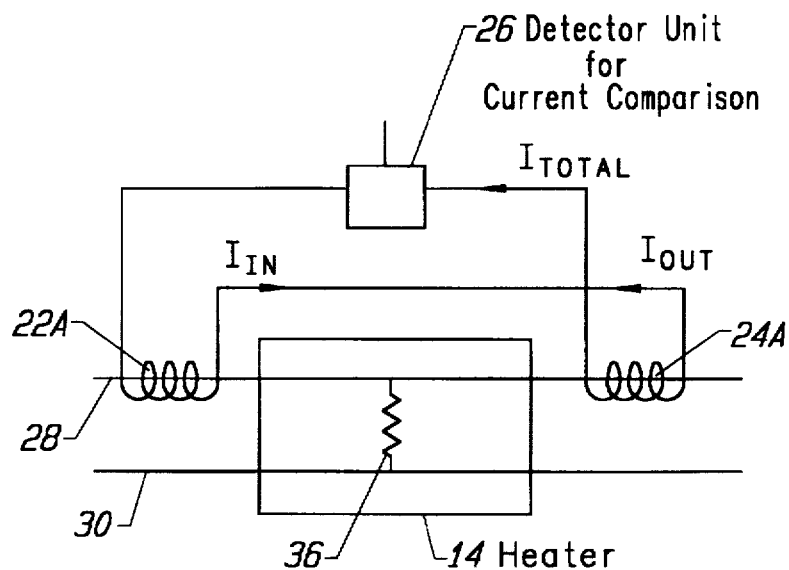
FIG. 2b is a schematic diagram of a heater and detector unit according to another embodiment of the invention.

FIG. 2b is a schematic diagram illustrating a heater and detector unit according to an alternative embodiment of the invention. In this embodiment of the invention, the inductive current detectors 22a, 24a are connected in opposing series with the detector unit 26, such that the current provided to the detector unit is a function of the input current minus the output current, i.e. $I_{in}-I_{out=Itotal}$. Thus, a current is detected when the heater is properly functioning, based upon the difference between the input current and the output current, while no current is detected if the heater is malfunctioning because the input current is equal to the output current.

Figure 3:
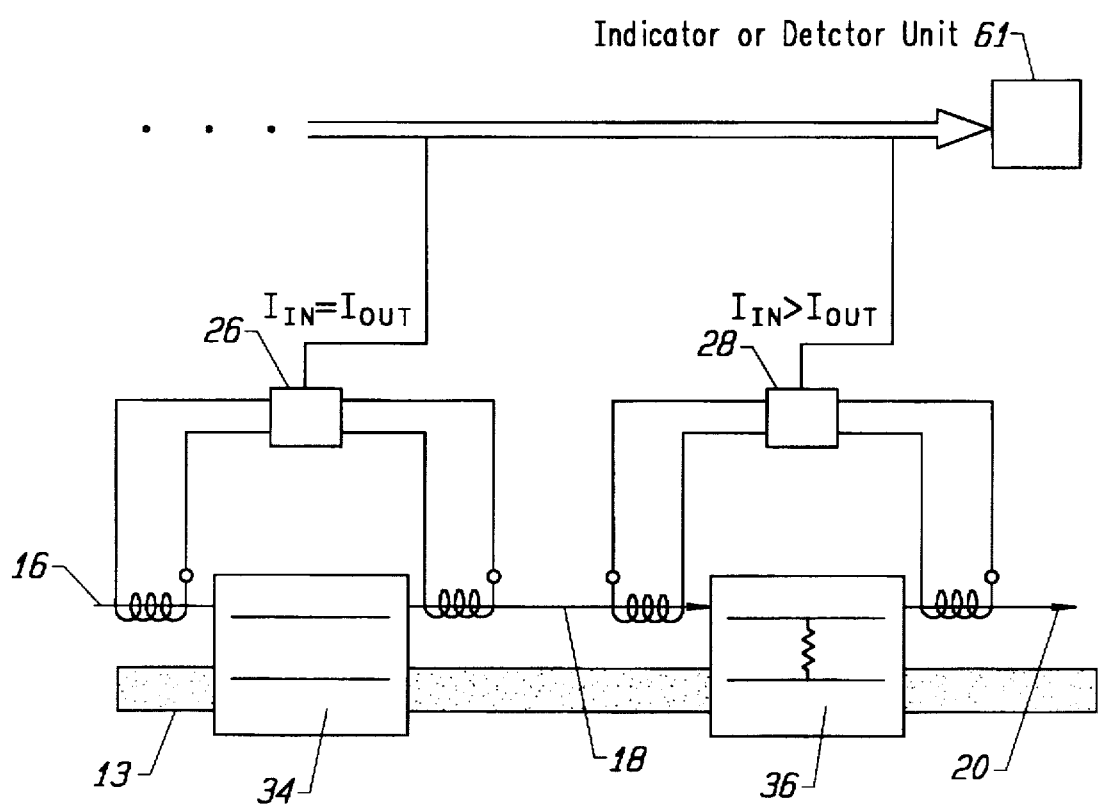
FIG. 3 is a schematic diagram of a daisy chain of failed and functioning heaters according to the invention.

FIG. 3 is a schematic diagram showing a daisy chain containing both failed and functioning heaters. The failed heater 34 has substantially equal input and output currents, while the functioning heater 36 has an output current that is lower than its input current.

Figure 4:
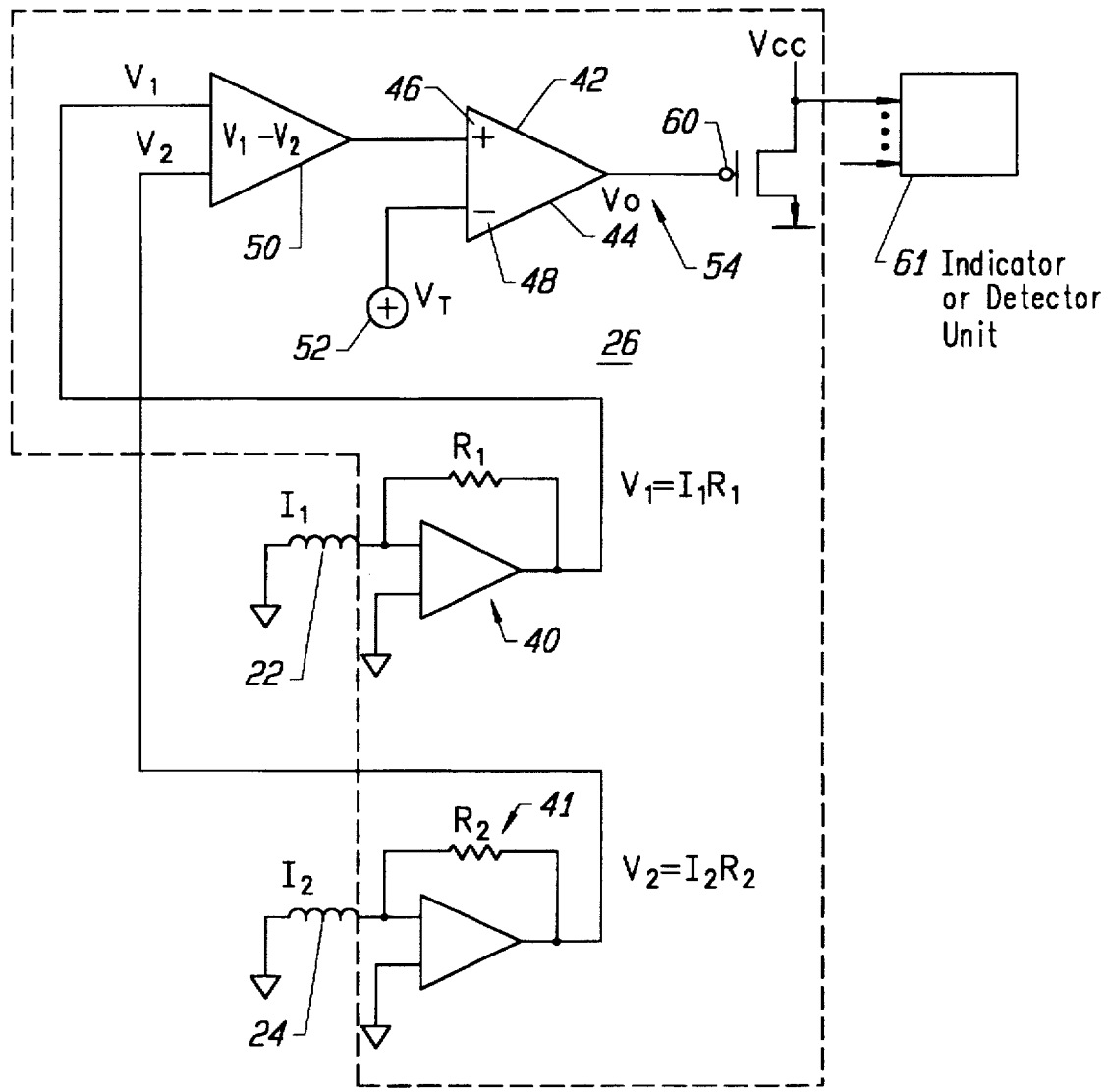
FIG. 4 is a circuit diagram of a comparator according to the invention.

In the preferred embodiment of the invention, a comparator circuit is used to measure an input and output voltage difference, which is derived from the input and output current of each heater in the daisy chain. A comparator may comprise, for example an operational amplifier. FIG. 4 is a circuit diagram of an exemplary comparator circuit 54 according to the invention. The voltages V1 and V2 are derived from the respective currents I1 and I2 by any known technique, such as the conversion circuits 40, 41. The voltage difference between an input voltage V1 and an output voltage V2, shown as V1–V2, is determined at a first operational amplifier circuit 50, and then communicated to the positive input 46 of a second operational amplifier circuit 44. A small bias voltage, referred to as VT, is supplied by a voltage source 52, and is applied to the negative input 48 of the second operational amplifier. The second operational amplifier saturates if V1–V2 is greater than VT. It is therefore preferable to supply as small a bias voltage as is possible to improve circuit noise immunity and eliminate false alarms, and thereby detect a voltage V1–V2 that is substantially equal to zero.

The output voltage of the comparator circuit 54, referred to as V0, generates a logic low signal "0" when the heater is functioning properly. When the heater is not functioning, V0 is equal to zero and a logic high signal "1" is generated. In the preferred embodiment of the invention, a latch 60 is responsive to a logic high condition and is therefore toggled 'on' when a non-functioning heater is detected. A signal may thereupon be sent to an indicator or detection unit 61 to give notice and location of the failed heater, for example by switching on a warning device, such as a light or a buzzer; or the signal may be connected to a device, such as a multiplexor, that generates an address for the particular heater, e.g. in a maintenance or fault detection system. Alternate embodiments of the invention use different types of detector units. For example if current transducers induce the input and output currents, analog circuitry may be used to measure the difference between the currents.

Figure 5:
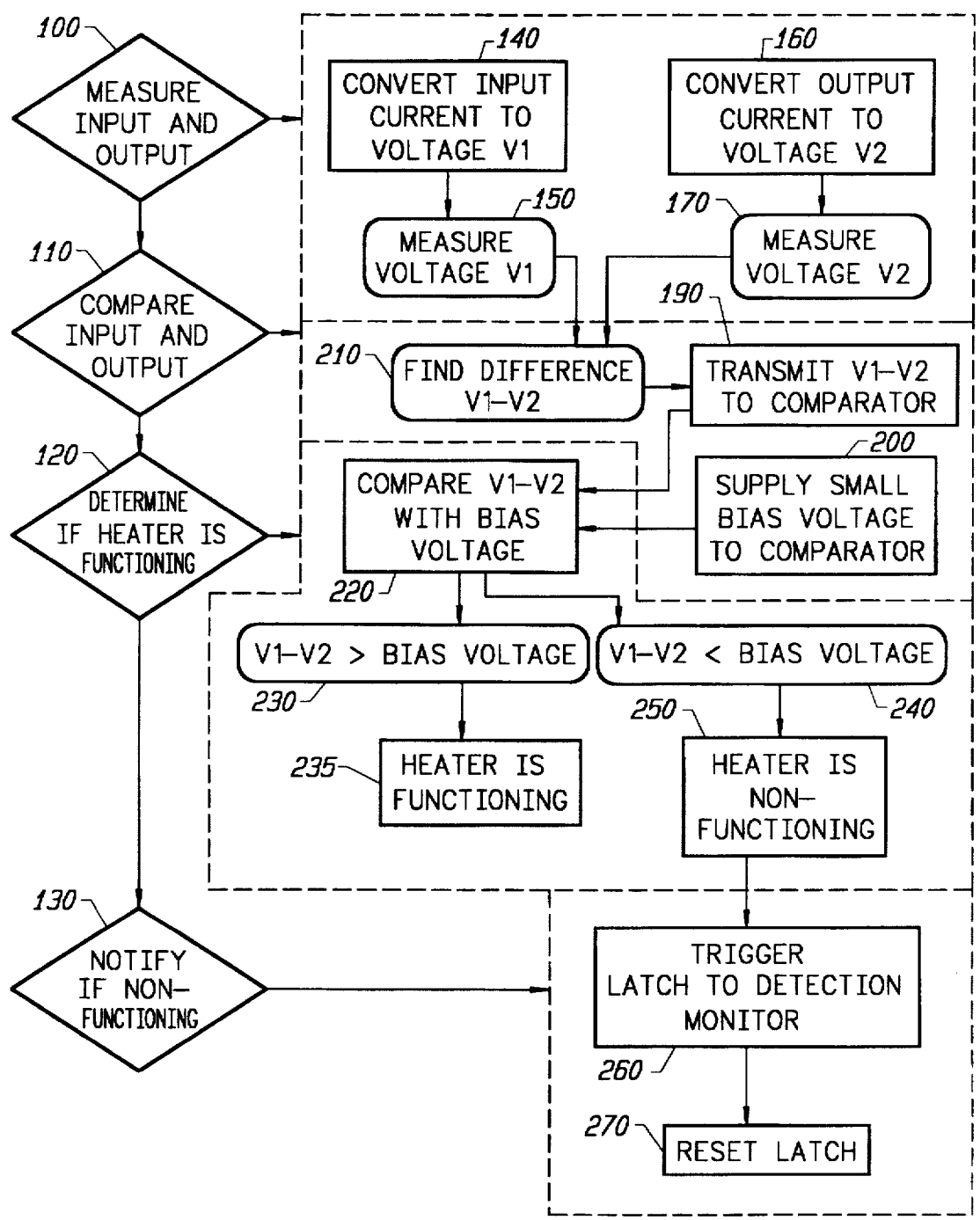
FIG. 5 is a flow chart illustrating the method for detecting a failed heater according to the invention.

FIG. 5 is a flow chart illustrating the method for detecting a failed heater according to the invention. Current inputs and outputs for an individual heater are measured (100) and then compared (110). A determination is then made if the heater is functioning (120) and notification sent if failure is indicated (130).

In the preferred embodiment of the invention, the input current is converted to a voltage V1 (140) and is then measured (150). Similarly, the output current is converted to a voltage V2 (160) and measured (170). The input/output voltage difference V1–V2 is determined (180) and transmitted to a comparator (190). V1–V2 is then compared (220) to a small bias voltage supplied to the comparator (200). If V1–V2 is greater than the bias voltage (230), the heater is functioning (235). If V1–V2 is less than the bias voltage (240) and thus approximately equals zero, the heater is not functioning (250). A logic high signal triggers a latch which is in communication with a detection monitor (260). The latch is reset once the heater has been repaired (270).

The latch can be used to condition a status line or to encode an address that provides an indication of both device failure and device location. In this way, a status or maintenance display may be configured by any known means to provide such indication at a remote location and/or provide a local alarm at the device location. It is contemplated that reset means may be provided, as well as logging and/or recording devices for producing a failure/correction record.

Additionally, it is contemplated that the information generated by the invention may be collected for use in a database system.

Although the invention is described herein with reference to the preferred embodiment, one skilled in the art will readily appreciate that other applications may be substituted for those set forth herein without departing from the spirit and scope of the invention. For example, the latch may be set to trigger a monitoring device, such as a light, when a heater is functioning properly. The latch may be set to open when a heater failure occurs, and the warning light turns off. While the preferred embodiment of the invention detects the failure of a heater placed along a pipeline, it will be apparent to one skilled in the art that the invention is also applicable to any array of electrical elements which are connected in parallel. For example, the invention may be applied to refrigeration units, illumination devices, or signal repeaters, e.g. in telephone or CATV systems. Accordingly, the invention should only be limited by the Claims included below.

I claim:

1. A method for detection and location of a failed load device that is connected in parallel with at least one other load device between a first electrical input line and a second electrical input line, comprising the steps of:

measuring current input to each of said connected devices through said first electrical input line with a first current monitor;

measuring current output from each of said connected devices through said first electrical input line with a second current monitor;

comparing said current input of each of said connected devices with said respective current output of said connected device; and sending a signal indicating device failure and device location if said current input of a device equals said current output of said device.

2. The method of claim 1, wherein said current measuring steps further comprise the step of inductively coupling a current transducer to said first electrical input line carrying said input current and said output current.

3. The method of claim 1, further comprising the step of converting said input current to a voltage, and the step of converting said output current to a voltage.

4. The method of claim 1, wherein said current measuring steps further comprise the step of measuring the Hall effect with a Hall effect device.

5. The method of claim 1, wherein said comparing step further comprises the step of determining the difference between said input and output currents with at least one comparator.

6. The method of claim 5, further comprising the steps of:

converting the difference between said input and output currents to a voltage;

transmitting said voltage to said comparator;

supplying a small bias voltage to said comparator;

comparing said voltage with said bias voltage;

transmitting a first logic signal in response to a voltage that indicates an input and output current difference that is greater than said bias voltage; and transmitting a second logic signal in response to a voltage that indicates an input and output current difference that is equal to said bias voltage, wherein a failed device is identified.

7. The method of claim 6, wherein said step of sending a signal further comprises the steps of:

toggling a latch in response to said first logic signal; and activating a detection monitor to provide notification of said failed device in response thereto.

8. A method for detection of a failed electrical device in a daisy chain connection between a first electrical input line and a second electrical input line, comprising the steps of:

measuring current input through said first electrical input line to each of said devices connected in said daisy chain with a first current monitor;

converting said measured current input to each of said devices to an input voltage;

measuring current output through said first electrical input line from each of said devices connected in said daisy chain with a second current monitor;

converting said measured current output from each of said devices to an output voltage;

measuring said input and output voltages of each of said devices;

finding the difference between said input and output voltages of each of said devices;

transmitting said measured input and output voltage difference of each of said devices to a comparator;

supplying a small bias voltage to said comparator;

comparing said measured input and output difference of each of said devices with said bias voltage;

generating a first logic signal in response to a measured input and output voltage difference of each of said devices that is greater than said bias voltage;

generating a second logic signal in response to a measured input and output voltage difference of each of said devices that is equal to or less than said bias voltage;

setting a latch in response to said first logic signal; and activating a detection monitor to identify location of each of said failed devices in response thereto.

9. An apparatus for detecting and locating a failed load device connected in parallel with at least one other load device between a first electrical input line and a second electrical input line, comprising:

a first current monitor for measuring current input to said device through said first electrical input line;

a second current monitor for measuring current output from said device through said first electrical input line;

a comparator for comparing said current input with said current output; and means for generating a signal indicating heater failure if said current input is equal to said current output.

10. The apparatus of claim 9, wherein said current monitor further comprises:

at least one inductor for developing signals indicative of current flow by inductive coupling to said first and second electrical input lines carrying said input current and said output currents.

11. The apparatus of claim 10, further comprising:

a first inductor for developing signals indicative of input current supplied to a load; and a second inductor for developing signals indicative of output current from said load.

12. The apparatus of claim 11, wherein said first inductor and said second inductor are in communication with separate inputs of said comparator.

13. The apparatus of claim 11, wherein said first inductor and said second inductor are connected in opposing series to provide a signal to said comparator, wherein said signal is provided in accordance with the following: $I_{total} = I_{in} - I_{out}$.

14. The apparatus of claim 9, further comprising:

a circuit for converting said input current to an input voltage, and for converting said output current to an output voltage.

15. The apparatus of claim 9, wherein said current measuring monitors further comprise:

at least one Hall effect device.

16. The apparatus of claim 14, further comprising:

means for generating a voltage difference signal from said input and output voltages;

a voltage source for supplying a bias voltage to said comparator;

wherein said comparator compares said voltage difference signal with said bias voltage, and generates a first logic signal if said voltage difference signal is greater than said bias voltage, and a generates a second logic signal if said voltage difference signal is equal to or less than said bias voltage, indicating the presence of a failed device.

17. The apparatus of claim 9, further comprising:

a latch responsive to said first and second logic signals for generating a signal indicative of device failure; and a detection monitor for identifying the location of said failed device in response thereto.

18. An apparatus for detecting a failed electrical device of a plurality of electrical devices that are connected in parallel between a first electrical input line and a second electrical input line, comprising:

a first current monitor circuit for converting a current input to said device through said first electrical input line to an input voltage;

a second current monitor circuit for converting a current output from said device through said first electrical input line to an output voltage;

means for measuring said input and output voltages;

a first comparator for determining the difference between said input and output voltages;

means for communicating a difference signal indicative of said input and output voltage difference to a second comparator;

a voltage source for supplying a bias voltage to said second comparator;

said second comparator so configured as to compare said difference signal with said bias voltage, and adapted to generate a first logic signal if said signal is greater than said bias voltage, and adapted to generate a second logic signal if said difference signal is equal to or less than said bias voltage;

a latch operable in response to said first and second logic signals to generate a failed device signal; and a detection monitor that identifies the location of said failed device in response thereto.

* * * * *